United States Patent
Weaver et al.

[11] Patent Number: 6,043,100
[45] Date of Patent: Mar. 28, 2000

[54] CHIP ON TAPE DIE REFRAME PROCESS

[76] Inventors: Kevin Weaver, 6804 Moselle Dr., San Jose, Calif. 95119; Terry Barrette, 192 N. Sunnyvale Ave., Sunnyvale, Calif. 94086

[21] Appl. No.: 08/635,288

[22] Filed: Apr. 19, 1996

[51] Int. Cl.[7] ................................................. H01L 21/66
[52] U.S. Cl. .................................................. 438/4; 438/15
[58] Field of Search ................................. 437/209, 219, 437/243, 923, 974; 438/4, 14, 15

[56] References Cited

U.S. PATENT DOCUMENTS

| | | |
|---|---|---|
| 4,771,330 | 9/1988 | Long . |
| 4,800,419 | 1/1989 | Long et al. . |
| 4,826,556 | 5/1989 | Kobayashi ........................... 156/345 |
| 4,842,662 | 6/1989 | Jacobi . |
| 4,933,741 | 6/1990 | Schroeder . |
| 4,965,072 | 10/1990 | Alexander et al. . |
| 4,972,253 | 11/1990 | Palino et al. . |
| 5,015,813 | 5/1991 | Yamada et al. . |
| 5,252,179 | 10/1993 | Ellerson et al. ........................ 156/345 |
| 5,424,254 | 6/1995 | Damiot ................................... 437/243 |
| 5,443,675 | 8/1995 | Wensink ................................. 156/345 |

OTHER PUBLICATIONS

Plastic Mad Decapsulation System ETAC–NSC no date.

*Primary Examiner*—Kevin Picardat

[57] ABSTRACT

A die is unpackaged from a Chip on Tape by grinding off molding compound from an upper surface of the COT until the COT's leads are evenly exposed across the upper surface, selectively etching out the leads using the remaining molding compound as a mask, removing an underlying layer of gold plating, and then removing the remaining molding compound. The unpacked die can then be reframed with new leads and molding compound for failure analysis and electrical failure verification.

46 Claims, 5 Drawing Sheets

FIG. 5
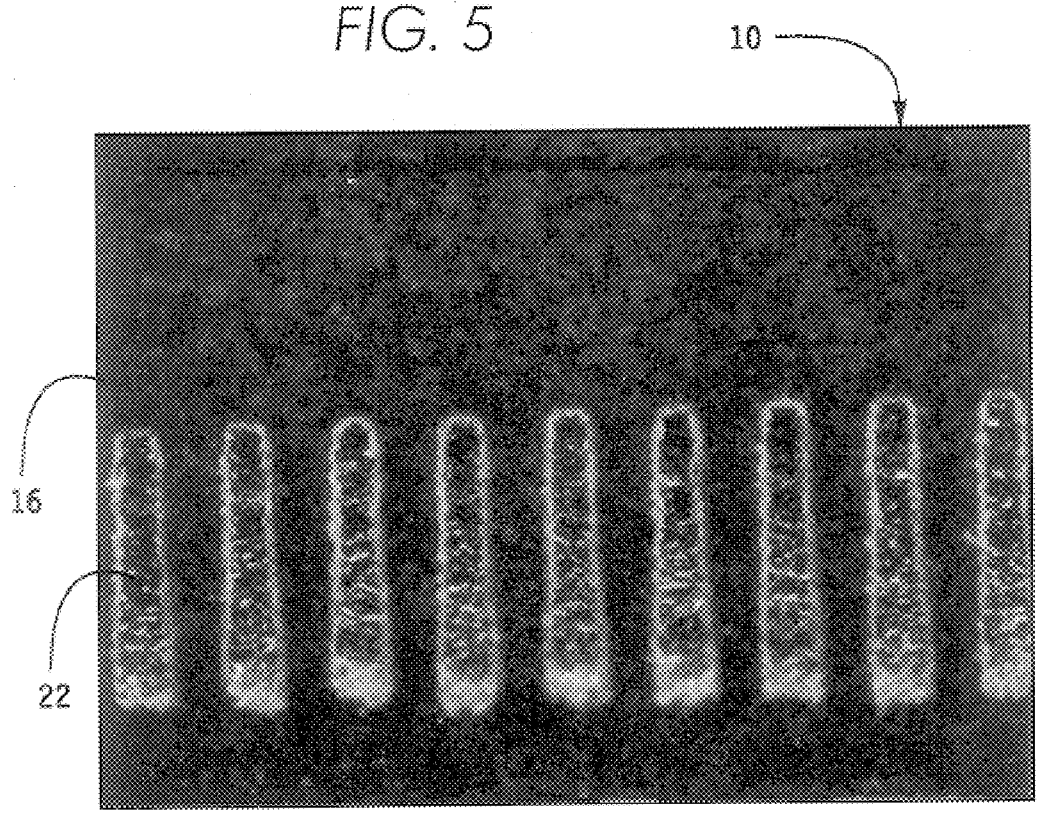
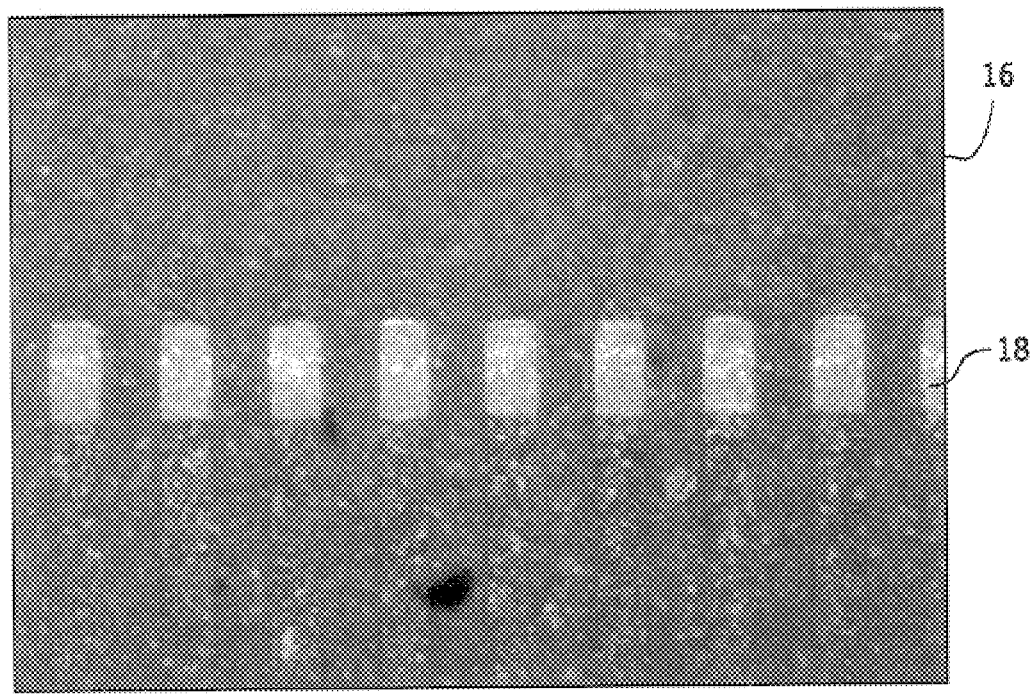
FIG. 6

CHIP ON TAPE DIE REFRAME PROCESS

BACKGROUND OF THE INVENTION

The invention relates to integrated circuits. More specifically, the invention relates to Chip on Tape packages.

At the heart of every integrated circuit is a small piece of semiconductor material known as a die. Rectangular or square in shape, the die is often no larger than a dime. Yet millions of transistors can be fabricated on it.

Surrounding the die is a mechanical package. The mechanical package includes conductors escaping from the die for connection to a printed circuit board. The package also includes a molding compound that protects the die and conductors from environmental "elements" such as moisture, dirt, stress, shock and vibration. Moisture, for example, can corrode the conductors. Stress, shock and vibration can damage the connections between the conductors and die. All of these elements can damage the die itself.

Many different types of mechanical packages are available. One type of mechanical package, known as a Chip on Tape (COT), is formed from a laminated tape and a molding compound. The laminated tape typically includes a thin layer of dielectric material and a leadframe, a layer of metal foil that is patterned by a photolithographic process into a plurality of leads or traces. The die is located in an opening in the tape and its bonding pads are bonded to leads extending into the opening. The opening is back-filled with the molding compound encapsulating the die and leadframe. Leads extending from the molding compound, known as pins, are adapted for connection to the printed wiring board. The COT is a thin, planar package having a high pin count.

In comparison to other mechanical packages such as plastic ball grid arrays (PBGAs) and Plastic Quad Flat Packs (PQFPs), the COT has a thinner profile and a higher pin count. These features make COTs very appealing to the computer industry as well as other industries where high pin count and low profile are extremely important.

As is often the case, a customer purchases a COT directly from a vendor and surface mounts the COT to a printed circuit board. During surface mounting, the pins of the COT are cut to size and soldered to the printed circuit board. After assembly, the printed circuit board is tested for functionality. If the printed circuit board fails the test, and the cause of failure is localized to the COT, the COT is removed from the board and returned to the vendor.

The COT is expensive enough to warrant electrical failure verification and failure analysis. If it is determined that the failure occurred because the die was defective, the customer is given a refund or credit. If, however, it is determined that the COT was damaged by the customer (for example, during mounting, programming or power up), the customer does not receive credit or a refund.

However, when the COT is returned to the vendor, the pins are usually mangled or destroyed. Such damage is caused by removing the COT from the board. Consequently, the COT is often in an untestable condition and cannot undergo electrical failure verification and failure analysis.

It is an objective of the present invention to be able to test a COT returned by a customer.

SUMMARY OF THE INVENTION

This objective is achieved by a method of unpackaging a die from a mechanical package according to the present invention. For a mechanical package including a leadframe and an encapsulant, the method comprises the steps of removing the encapsulant from a surface of the mechanical package until the leadframe is evenly exposed across the surface; removing the leadframe using the encapsulant that remains as a mask; and removing the remaining encapsulant from the die. The die is unpackaged without altering its electrical functionality and without damaging its circuitry and bond pads. This allows the die to be reframed and tested.

According to other aspects of the invention, the encapsulant can be removed from an upper surface of the mechanical package by a grinding operation. The grinding operation can be performed by holding the mechanical package against a grinding wheel with a grinding chuck. Additionally, the leadframe can be removed by etching it out of the encapsulant, and the die can be plasma etched after the remaining encapsulant is removed.

BRIEF DESCRIPTION OF THE DRAWINGS

FIG. 5 is a photograph of the COT with its leadframe removed;

FIG. 6 is a photograph of the COT with its gold plating removed;

DETAILED DESCRIPTION OF THE PREFERRED EMBODIMENTS

Figure 1:
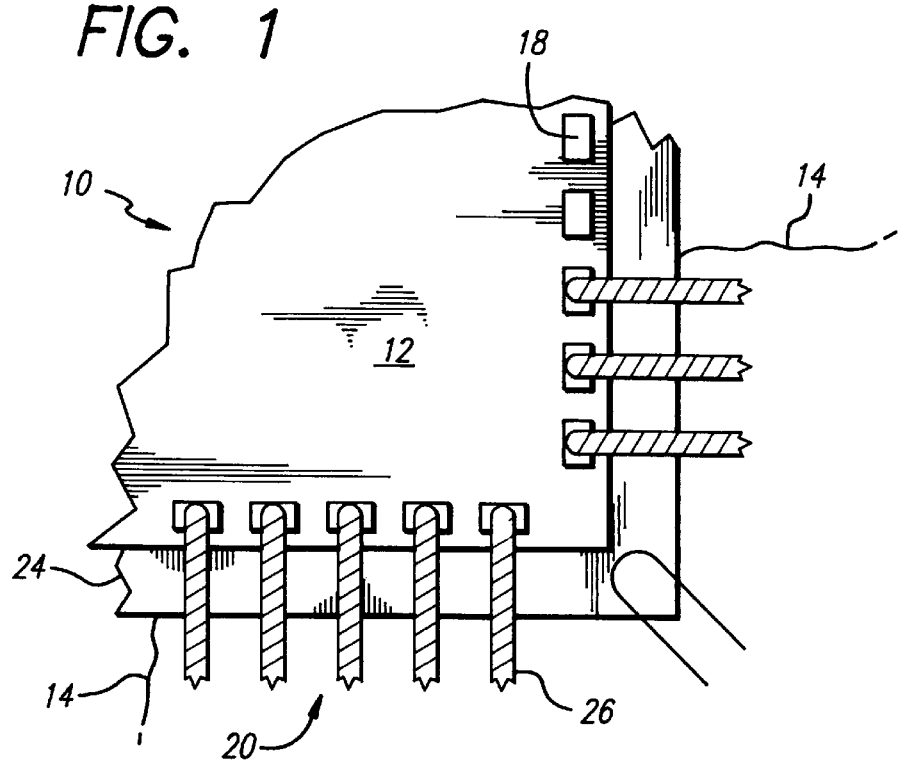
FIG. 1 is an illustration of a portion of a Chip on Tape including a die on a leadframe tape.
Figure 2:
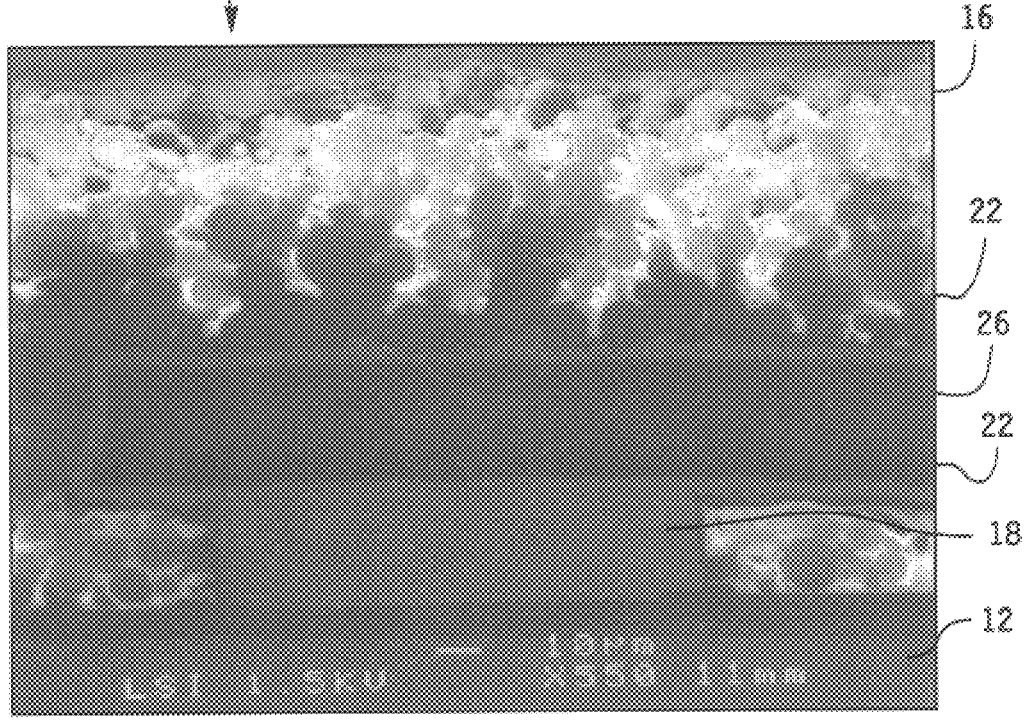
FIG. 2 is an SEM photograph of a cross section of a Chip on Tape.

FIGS. 1 and 2 show a portion of a COT 10 including a die 12, a leadframe tape 14 and a molding compound 16. The die 12 has a plurality of gold bond pads 18 around its periphery. The thickness of each bond pad 18, uncompressed, is approximately twenty five microns. Each bond pad 18 provides an electrical connection to a cell on the die 12. A passivation layer of silicon nitride protects the upper surface of the die 12 from scratching.

The tape 14 includes a leadframe 20 that is laminated between two thin layers of an insulating material. Leads 26 of the leadframe 20 are made of a copper base material and have a thickness of approximately thirty microns. The leads 26 are surrounded by gold plating 22 having a thickness of approximately three microns. The gold plating 22 protects the copper base material of the leads 26 from moisture in the atmosphere. Even though the leads 26 are covered by the molding compound 16, moisture can still seep through the molding compound 16 and cause the copper base material to corrode. The gold plating 22 also protects the leads 26 from silicon filler material in the molding compound 16.

An opening 24 large enough to accommodate the die 12 is located in the tape 14. Leads 26 extend into the opening 24.

The die 12 is packaged or framed as follows. The die 12 is placed face-up and the tape 14 is positioned over the die 12 such that the leads 26 extending into the opening 24 are over the bond pads 18. Several of the leads 26 are bonded to the bond pads 18 by ultrasonics. Then the remaining leads 26 are bonded to the bond pads 18 by ultrasonics. In addition to protecting the leads 26, the gold plating 22 facilitates a good bond between the leads 26 and the bond pads 18 on the die 12. The opening 24 is then back-filled with the molding compound 16 to a thickness of about seventy microns from an upper surface of the die 12. The molding compound 16, which can be an epoxy resin, covers the leadframe 20 and all but the back of the die 12. The die 12, which is exposed through the back of the tape 14, can be attached to a heat sink by a thermal adhesive (not shown). Hereinafter, the "front" or "upper surface" of the COT 10 will be referred to as that portion of the COT 10 including the bond pads 18 and leadframe 20.

Figure 3:
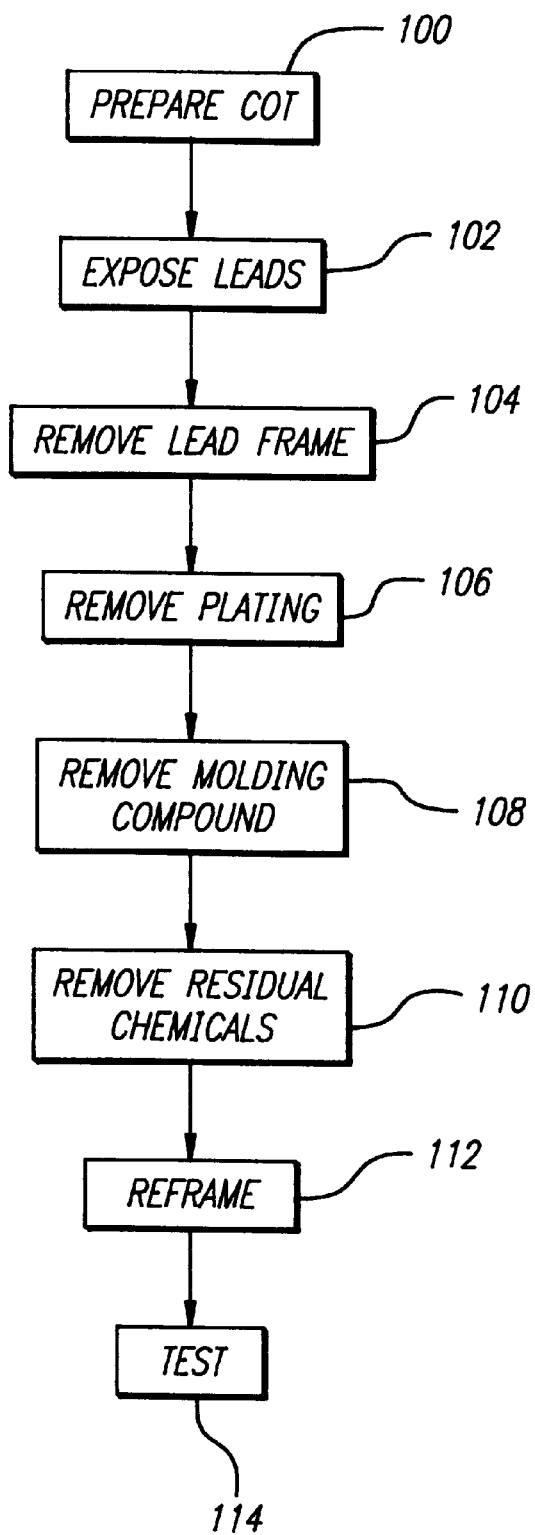
FIG. 3 is a flowchart of a method of repackaging a Chip on Tape according to the present invention.

FIG. 3 shows steps 100–114 of a method for testing a COT 10 having its pins damaged. In step 100, the COT 10 is prepared for unpackaging by stripping the thermal adhesive. The thermal adhesive can be scraped off from the COT 10 after the COT 10 is soaked in an acetone bath for five minutes. Additionally, that portion of the leads 26 extending from the molding compound 16 is cut away.

Figure 4:
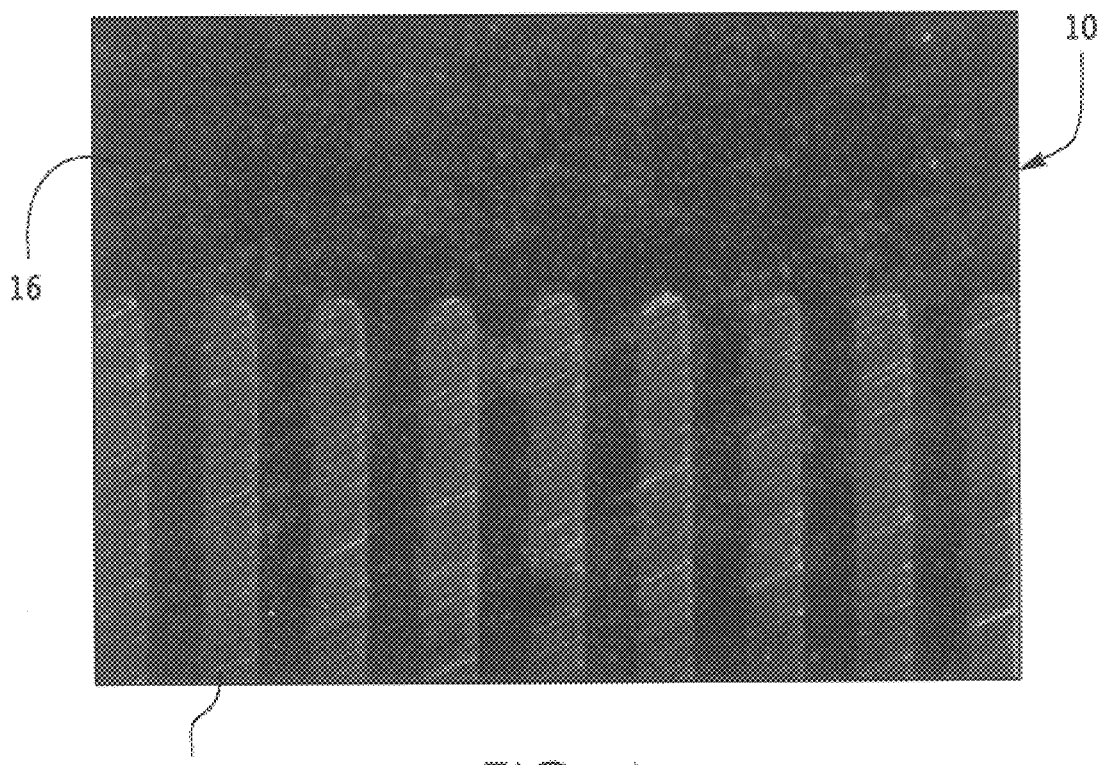
FIG. 4 is a photograph of the COT with molding compound and gold plating removed from an upper surface.

In step 102, the molding compound 16 is removed until the copper base material of the leads 26 is exposed relatively evenly across the upper surface of the COT 10 (see FIG. 4). The molding compound 16 is removed by a grinding operation. During the grinding operation, the gold plating 22 on the upper surface of the leads 26 is also removed. Analysis under the microscope indicates whether the leads 26 are exposed evenly. If the exposure is not even, the COT 10 cannot be reframed. Since the distance between the top of the leads 26 and the top of the bond pads 18 is only about thirty three microns, non-uniform removal would, in all likelihood, result in the bond pads 18 being undercut or lifted, or the die 12 being scratched. Undercutting or lifting the bond pads 18, in turn, would prevent new leads from being bonded to the die 12 during reframing. Scratching the die 12 would alter its electrical functionality. The grinding operation is described below in connection with FIG. 8.

In step 104, the leads 26 are removed using the remaining molding compound 16 as a mask (see FIG. 5). A chemical etching process such as wet etching is used to remove the leads 26. Wet etching is performed by placing the COT 10 in a bath of a solution that reacts with the copper base material of the leads 26 but does not attack the gold plating 22. If the gold plating 22 is attacked, the bond pads 18 could also be attacked and reduced in size. Consequently, new leads could not be bonded to the reduced bond pads. Wet etching in step 104 can be performed, for example, by immersing the COT 10 in a solution of 71% Nitric Acid at 55° C. for one minute. Any uniformity problems due to uneven grinding or height are compensated for within the thirty micron thickness of the copper base material. The copper base material having been removed, only the gold plating 26 remains.

In step 106, the gold plating 22 is removed and the bond pads 18 are exposed (see FIG. 6). The gold plating 22 can be removed by a chemical etching process such as wet etching. Wet etching is performed by immersing the COT 10 in a bath of a solution that attacks gold. Care must be taken not to immerse the COT 10 for too long a time; otherwise the bond pads 18 will also be attacked. Therefore, the COT 10 is immersed in the bath just long enough for the three micron thickness of the gold plating 22 to be removed. Wet etching in step 106 can be performed, for example, by immersing the COT 10 in a solution of 3:1 Hydrochloric to Nitric acid for three minutes at 20° C.

Figure 7:
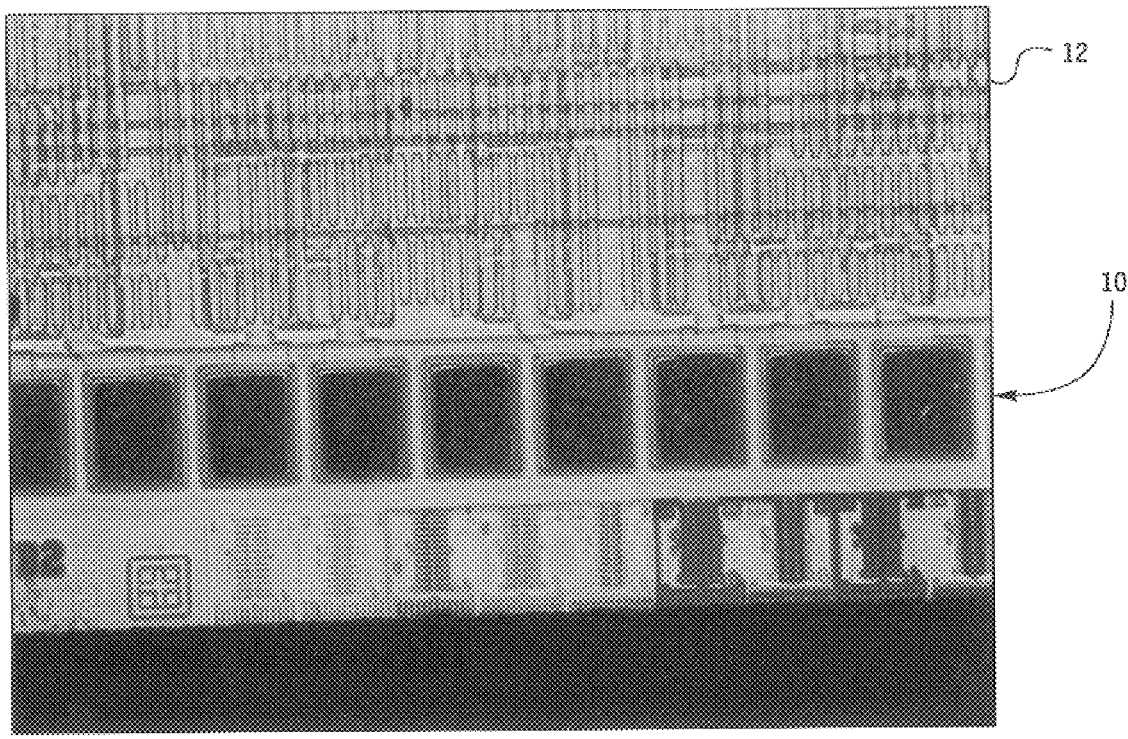
FIG. 7 is a photograph of the COT after the molding compound is removed.

In step 108, after the gold plating 22 has been removed, the molding compound 16 is removed. The molding compound 16 can be removed by placing the COT 10 in a bath of fuming sulfuric acid for two minutes at 55° C. and then fuming nitric acid for five minutes at room temperature. This should be sufficient to break the bonds of the molding compound 16. Once the molding compound 16 is removed, only the die 12 remains (see FIG. 7).

In step 110, residual chemicals left on the surface of the die 12 are removed. The die 12 is placed in an acetone bath two to five minutes to dilute the wet etching chemicals. After the die 12 is removed from the acetone bath, it is cleaned ultrasonically. The acetone bath and ultrasonic cleaning is performed three times. Then, the die 12 is plasma etched to react any residual chemicals left on the surface of the die 12 and to prevent continued etching of the bond pads 18 after the die 12 has been removed from the wet acid baths. Plasma etching can be performed by placing the die 12 in a plasma etcher with 100 sccm $O_2$ flow at 40 mTorr for 60 minutes, 150 watts.

The die 12 that remains has its electrical functionality and bond pads 18 in tact. It is in a condition to be reframed and retested.

In step 112, the die 12 is reframed with a new leadframe tape and a new molding compound. Leads from the new tape are connected to the bond pads 18 on the die 12. Then the die 12 and new tape are encapsulated with the new molding compound. Because there are no alterations to the die 12 and only slight reduction in the height of the bond pads 18 (due to being compressed twice), the leads of the new tape can be successfully bonded to the die 12. This allows the functionality of the die 12 to be subjected to electrical failure verification and failure analysis, which can be performed by ATE and F/a test equipment (step 114).

The method above was performed on a batch of twenty five COTs having "electrically good" dies. Twenty of the twenty five COTs were successfully unpackaged and reframed.

Figure 8:
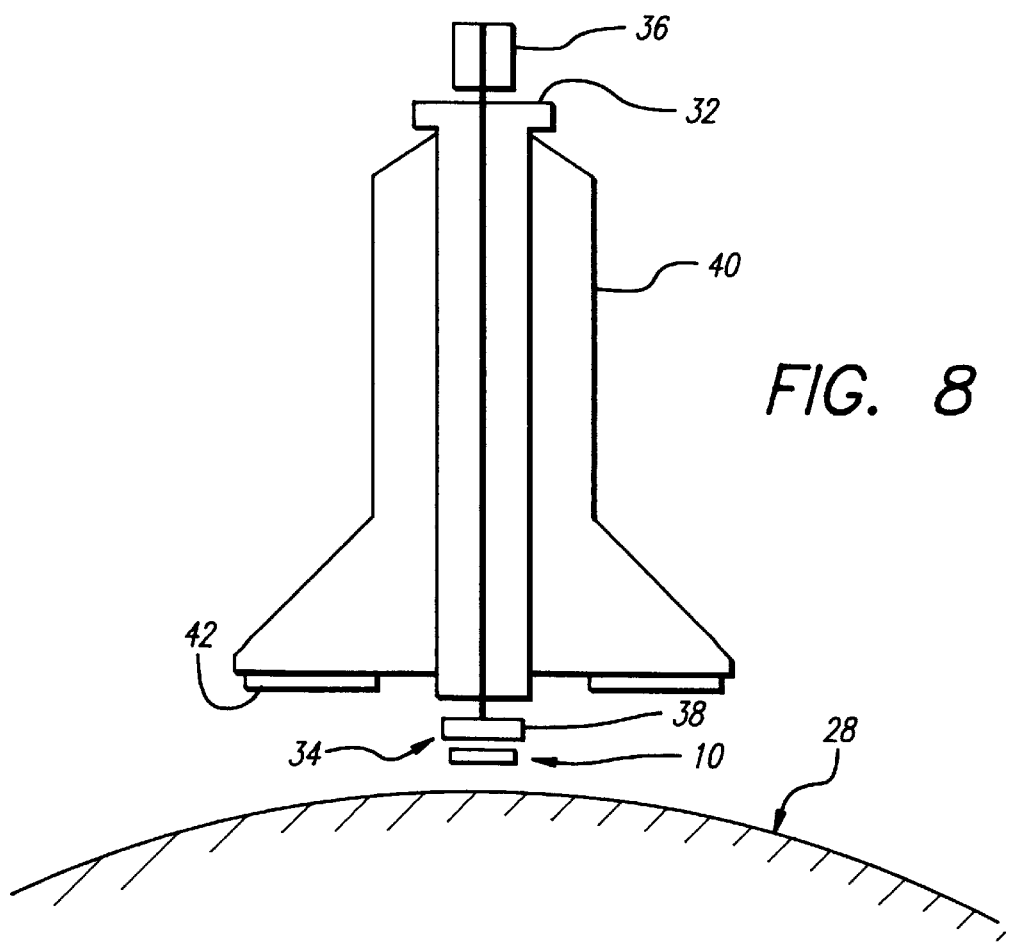
FIG. 8 is an illustration of a grinding wheel and chuck for holding the COT during a grinding operation, the grinding operation forming a part of the method shown in FIG. 3.

FIG. 8, describes the grinding operation (step 102) in greater detail. Grinding is done manually with a grinding wheel 28 and a metal grinding chuck 30. The grinding wheel 28 has nine micron aluminum oxide particles and a radius of eight inches. Such grinding wheels are commercially available.

The grinding chuck 30 includes an elongated shaft 32 that is threaded internally and a retaining screw 34 that is threaded through the shaft 32. A lock nut 36 secures the retaining screw 34 to the shaft 32. The back surface of the COT 10 is secured to the head 38 of the retaining screw 34 by means such as melted wax or double-backed adhesive tape. Fins 40 extend radially outwards from the shaft 32. Offset feet 42 are located at bottom surfaces of the fins 40 to compensate for the curvature of the grinding wheel 28. The grinding chuck 30 has an overall length of approximately five inches and a diameter of approximately two inches. The chuck 30 can be of the type commonly used for preparing very thin viewing samples for TEM. Such chucks are commercially available.

An operator uses the grinding chuck 30 to position the upper surface of the COT 10 against the grinding wheel 28. A minimal amount of pressure is applied on the grinding chuck 30 by the operator. Excessive pressure can cause the silicon filler particles in the molding compound 16 to crack the passivation layer of silicon nitride on the die 12. During the grinding operation, the chuck 30 is cooled under flowing water to prevent heat from flowing to die 12.

The grinding wheel 28 is rotated at a speed between forty and fifty rpm. Care must be taken not to rotate the grinding wheel 28 at too high a speed, otherwise the molding compound 16 will crack. Moreover, once the speed is selected, it must remain constant throughout the grinding operation.

Thus disclosed is a method of unpackaging a die in such a manner that the unpackaged die is still in condition for reframing. Reframing allows for electrical failure verification and failure analysis of the die.

It is understood that various changes and modifications may be made without departing from the spirit and scope of the invention. Different processes could be used to remove the layers and metals. It is also understood that the COT dimensions disclosed herein are merely exemplary and are provided only to illustrate the relative thicknesses of the die, bond pads, leadframe, gold plating and molding compound. Finally, it is understood that application of the invention is not limited to COTs, but can be applied to any die bonded to a leadframe and encapsulated with a molding compound. Accordingly, the present invention is not limited to the precise embodiment described hereinabove. Instead, it is defined by the claims that follow.

We claim:

1. A method of unpackaging a COT, the COT including a die having a plurality of bond pads, a leadframe having leads bonded to the bond pads, plating on the leads and an encapsulant for the leadframe and die, the method comprising the steps of:

grinding an upper surface of the encapsulant until the leads are evenly exposed across the upper surface, whereby the plating on an upper surface of the leads is also removed;

wet etching the leads until the leads are removed, whereby the encapsulant that remains is used as a mask;

wet etching the plating until the plating is removed; and removing the remaining encapsulant from the die.

2. The method of claim 1, wherein the grinding operation is performed by holding the COT against a grinding wheel with a grinding chuck.

3. The method of claim 1, wherein the leads are made of a copper base material and wherein the wet etching of the leads is performed by immersing the COT in a bath of nitric acid.

4. The method of claim 1, wherein the plating is made of gold, and wherein the plating is wet etched with a solution of 3:1 hydrochloric to nitric acid.

5. The method of claim 1, wherein the encapsulant is a molding compound, and wherein the molding compound is removed by placing the COT in baths of fuming sulfuric acid and fuming nitric acid.

6. The method of claim 1, further comprising the step of plasma etching the die after the encapsulant has been removed.

7. The method of claim 6, wherein plasma etching is performed by placing the die in approximately 100 standard cubic centimeters per minute of oxygen flow at a pressure of approximately 40 mTorr for approximately 60 minutes, 150 watts.

8. A method of unpackaging a die from a mechanical package including leads and an encapsulant, the method comprising the steps of:

removing the encapsulant from a surface of the mechanical package until the leads are evenly exposed across the surface;

removing the leads by wet etching using the encapsulant that remains as a mask; and removing the remaining encapsulant from the die.

9. The method of claim 8 wherein the encapsulant is removed by a grinding operation.

10. The method of claim 9 wherein the grinding operation is performed by holding the encapsulant against a grinding wheel with a grinding chuck.

11. The method of claim 8 wherein the leads are made of a copper base material, and wherein the wet etching is performed by immersing the mechanical package in a bath of nitric acid.

12. The method of claim 8 wherein the encapsulant is a molding compound, and wherein the molding compound is removed by placing the mechanical package first in a bath of fuming sulfuric acid and then in a bath of fuming nitric acid.

13. The method of claim 8 further comprising the step of removing residual chemicals left on the surface of the die after the encapsulant has been removed.

14. The method of claim 13 wherein the residual chemicals are removed by plasma etching.

15. The method of claim 14 wherein the plasma etching is performed by placing the die in approximately 100 standard cubic centimeters per minute of oxygen flow at a pressure of approximately 40 mTorr for approximately 60 minutes, 150 watts.

16. The method of claim 8 further comprising the steps of: reframing the die with new leads; and testing the reframed die.

17. A method of unpackaging a die from a mechanical package including leads and an encapsulant, the method comprising the steps of:

removing encapsulant from a surface of the mechanical package until the leads are evenly exposed across the surface;

removing the leads using chemical etching; and removing the remaining encapsulant from the die.

18. The method of claim 17 wherein said chemical etching uses encapsulant that remains as a mask.

19. The method of claim 17 wherein the encapsulant is removed by a grinding operation.

20. The method of claim 19 wherein the grinding operation is performed by holding the encapsulant against a grinding wheel with a grinding chuck.

21. The method of claim 17 wherein the chemical etching comprises wet etching.

22. The method of claim 21 wherein the leads are made of a copper base material, and wherein the wet etching is performed by immersing the mechanical package in a bath of nitric acid.

23. The method of claim 17 wherein the encapsulant is a molding compound, and wherein the molding compound is removed by placing the mechanical package first in a bath of fuming sulfuric acid and then in a bath of fuming nitric acid.

24. The method of claim 17 further comprising the step of removing residual chemicals left on the surface of the die after the encapsulant has been removed.

25. The method of claim 24 wherein the residual chemicals are removed by plasma etching.

26. The method of claim 25 wherein the plasma etching is performed by placing the die in approximately 100 standard cubic centimeters per minute of oxygen flow at a pressure of approximately 40 mTorr for approximately 60 minutes, 150 watts.

27. The method of claim 17 further comprising the steps of: reframing the die with new leads; and testing the reframed die.

28. A method of unpackaging a die from a mechanical package including leads and an encapsulant, the method comprising the steps of:

removing the encapsulant from a surface of the mechanical package until the leads are evenly exposed across the surface;

removing the leads using the encapsulant that remains as a mask;

removing the remaining encapsulant from the die; and removing residual chemicals left on the surface of the die by plasma etching, after the encapsulant has been removed.

29. The method of claim 28 wherein the encapsulant is removed by a grinding operation.

30. The method of claim 29 wherein the grinding operation is performed by holding the encapsulant against a grinding wheel with a grinding chuck.

31. The method of claim 28 wherein the leads are removed by wet etching.

32. The method of claim 31 wherein the leads are made of a copper base material, and wherein the wet etching is performed by immersing the mechanical package in a bath of nitric acid.

33. The method of claim 28 wherein the encapsulant is a molding compound, and wherein the molding compound is removed by placing the mechanical package first in a bath of fuming sulfuric acid and then in a bath of fuming nitric acid.

34. The method of claim 28 wherein the plasma etching is performed by placing the die in approximately 100 standard cubic centimeters per minute of oxygen flow at a pressure of approximately 40 mTorr for approximately 60 minutes, 150 watts.

35. The method of claim 28 further comprising the steps of: reframing the die with new leads; and testing the reframed die.

36. A method of unpackaging a die from a mechanical package including leads having a copper base material and a gold plating, gold bond pads and an encapsulant, the method comprising the steps of:

removing the encapsulant from a surface of the mechanical package until the leads are evenly exposed across the surface; and exposing the leads to a substance which attacks the copper base material of the leads but does not attach the gold plating and thereby does not attack the gold bond pads.

37. The method of claim 36 wherein the substance is a nitric acid solution.

38. The method of claim 36 wherein the substance is a solution of 71% nitric acid, and said exposing includes immersing the mechanical package in the solution at 55° C. for one minute.

39. The method of claim 36 further comprising removing the remaining encapsulant from the die.

40. The method of claim 39 wherein the encapsulant is removed by a grinding operation.

41. The method of claim 40 wherein the grinding operation is performed by holding the encapsulant against a grinding wheel with a grinding chuck.

42. The method of claim 39 wherein the encapsulant is a molding compound, and wherein the molding compound is removed by placing the mechanical package first in a bath of fuming sulfuric acid and then in a bath of fuming nitric acid.

43. The method of claim 38 further comprising the step of removing residual chemicals left on the surface of the die after the encapsulant has been removed.

44. The method of claim 43 wherein the residual chemicals are removed by plasma etching.

45. The method of claim 44 wherein the plasma etching is performed by placing the die in approximately 100 standard cubic centimeters per minute of oxygen flow at a pressure of approximately 40 mTorr for approximately 60 minutes, 150 watts.

46. The method of claim 36 further comprising the steps of: reframing the die with new leads; and testing the reframed die.

* * * * *